(12) United States Patent
Visokay

(10) Patent No.: US 7,709,349 B2
(45) Date of Patent: May 4, 2010

(54) SEMICONDUCTOR DEVICE MANUFACTURED USING A GATE SILICIDATION INVOLVING A DISPOSABLE CHEMICAL/MECHANICAL POLISHING STOP LAYER

(75) Inventor: Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 412 days.

(21) Appl. No.: 11/750,439

(22) Filed: May 18, 2007

(65) Prior Publication Data

US 2008/0283932 A1 Nov. 20, 2008

(51) Int. Cl.
*H01L 21/76* (2006.01)
*H01L 21/4763* (2006.01)

(52) U.S. Cl. .............. 438/444; 438/633; 438/634; 438/635; 438/644

(58) Field of Classification Search .......... 438/444, 438/633, 634, 635, 644
See application file for complete search history.

(56) References Cited

U.S. PATENT DOCUMENTS

| | | | | |
|---|---|---|---|---|
| 5,233,212 A | * | 8/1993 | Ohi et al. ............... | 257/390 |
| 5,380,673 A | * | 1/1995 | Yang et al. ............. | 438/396 |
| 5,413,950 A | * | 5/1995 | Chen et al. ............. | 438/253 |
| 5,567,640 A | * | 10/1996 | Tseng ................... | 438/396 |
| 5,591,302 A | * | 1/1997 | Shinohara et al. ....... | 438/717 |
| 5,807,761 A | * | 9/1998 | Coronel et al. .......... | 438/14 |
| 5,930,639 A | * | 7/1999 | Schuele et al. .......... | 438/396 |
| 6,074,943 A | * | 6/2000 | Brennan et al. ......... | 438/636 |
| 6,171,970 B1 | * | 1/2001 | Xing et al. ............. | 438/706 |
| 6,211,035 B1 | * | 4/2001 | Moise et al. ........... | 438/396 |

* cited by examiner

*Primary Examiner*—Howard Weiss
*Assistant Examiner*—Steven H Rao
(74) *Attorney, Agent, or Firm*—Warren L. Franz; Wade J. Brady, III; Frederick J. Telecky, Jr.

(57) ABSTRACT

In one aspect, there is provided a method of manufacturing a semiconductor device that comprises placing a blocking layer, a CMP stop layer and a bulk oxide layer over an oxide cap layer that is located over gate structures and source/drains located adjacent thereto. The bulk oxide layer and the CMP stop layer are removed with a CMP process to expose the top of gate electrodes and are removed from over the source/drain areas with a wet etch. The CMP stop layer has a CMP removal rate that is less than a CMP removal rate of the bulk oxide layer and has a wet etch removal rate that is greater than a wet etch removal rate of the blocking layer.

18 Claims, 6 Drawing Sheets

SEMICONDUCTOR DEVICE MANUFACTURED USING A GATE SILICIDATION INVOLVING A DISPOSABLE CHEMICAL/MECHANICAL POLISHING STOP LAYER

TECHNICAL FIELD

A semiconductor device and manufacture of that device are presented in which embodiments are directed to a semiconductor device and a method of manufacture therefor that uses gate silicidation involving a disposable chemical/mechanical polishing (CMP) stop layer.

BACKGROUND

Metal gate electrodes are currently being investigated to replace polysilicon gate electrodes in today's ever shrinking and changing transistor devices. One of the principal reasons the industry is investigating replacing the polysilicon gate electrodes with metal gate electrodes is to solve problems of poly-depletion effects and boron penetration for future CMOS devices. Traditionally, a polysilicon gate electrode with an overlying silicide was used for the gate electrodes in CMOS devices. However, as device feature sizes continue to shrink, poly depletion and gate sheet resistance become serious issues when using polysilicon gate electrodes.

Accordingly, metal gates have been proposed. However, in order to optimize the threshold voltage ($V_t$) in high-performance devices, the metal gates need tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS.

Recently, silicided metal gates have been investigated based on the extension of existing self-aligned silicide (salicide) technology. In this approach, polysilicon is deposited over the gate dielectric. A metal is deposited over the polysilicon and reacted to completely consume the polysilicon, resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

SUMMARY

In one embodiment, the method comprises placing a blocking layer over an oxide cap layer located over a gate electrode and sidewall spacers and source/drains located adjacent thereto. A CMP stop layer is formed over the blocking layer and a bulk oxide layer is formed over the CMP stop layer. The bulk oxide layer is removed with a CMP process to expose at least the CMP stop layer located over the gate electrode, wherein a removal rate of the bulk oxide layer is at least about 3 times greater than a removal rate of the CMP stop layer. The CMP stop layer, the blocking layer, and the oxide cap layer are removed to expose a top portion of the gate electrode, and the bulk oxide and the CMP stop layer located over the source/drains are removed with a wet etch, wherein a wet etch removal rate of the CMP stop layer is at least about 10 times greater than a removal rate of the blocking layer.

In another embodiment, a method of manufacturing a semiconductor device comprises placing a blocking layer formed with bis(tertiarybutylamino)silane (BTBAS) precursor over a silicon dioxide cap layer located over a gate electrode and sidewall spacers and source/drains located adjacent thereto. A CMP stop layer comprising silicon nitride is formed over the blocking layer, and a bulk silicon oxide layer is formed over the CMP stop layer. The bulk silicon oxide layer is removed with a CMP process to remove at least a portion of the CMP stop layer located over the gate electrode, wherein a removal rate of the bulk silicon oxide layer is at least about 3 times greater than a removal rate of the CMP stop layer. The CMP stop layer, the blocking layer, and the cap silicon dioxide cap layer are removed to expose a top portion of the gate electrode, and the bulk silicon oxide and the CMP stop layer located over the source/drains are removed with a wet etch, wherein a wet etch removal rate of the CMP stop layer is at least about 10 times a removal rate of the blocking layer.

Another embodiment provides a semiconductor device that comprises a plurality of transistors including silicided gate electrodes having source/drains that are located in wells associated therewith. The silicided gate electrodes are formed by placing a blocking layer formed with bis(tertiarybutylamino)silane (BTBAS) precursor over a silicon dioxide cap layer located over a gate electrode and sidewall spacers and source/drains located adjacent thereto; forming a CMP stop layer comprising silicon nitride over the blocking layer; forming a bulk silicon oxide layer over the CMP stop layer; removing the bulk oxide layer with a CMP process to remove at least a portion of the CMP stop layer located over the gate electrode, wherein a removal rate of the bulk oxide layer is at least about 3 times greater than a removal rate of the CMP stop layer; removing the CMP stop layer, the blocking layer, and the cap layer to expose a top portion of the gate electrode; and removing the bulk oxide and the CMP stop layer located over the source/drains with a wet etch, wherein a wet etch removal rate of the CMP stop layer is at least about 10 times greater than a removal rate of the blocking layer. The device also includes dielectric layers located over the transistors, and interconnects formed over or within the dielectric layers that interconnect the transistors.

BRIEF DESCRIPTION OF THE DRAWINGS

For a better understanding, reference is now made to the following descriptions taken in conjunction with the accompanying drawings, in which.

DETAILED DESCRIPTION

Figure 1A:
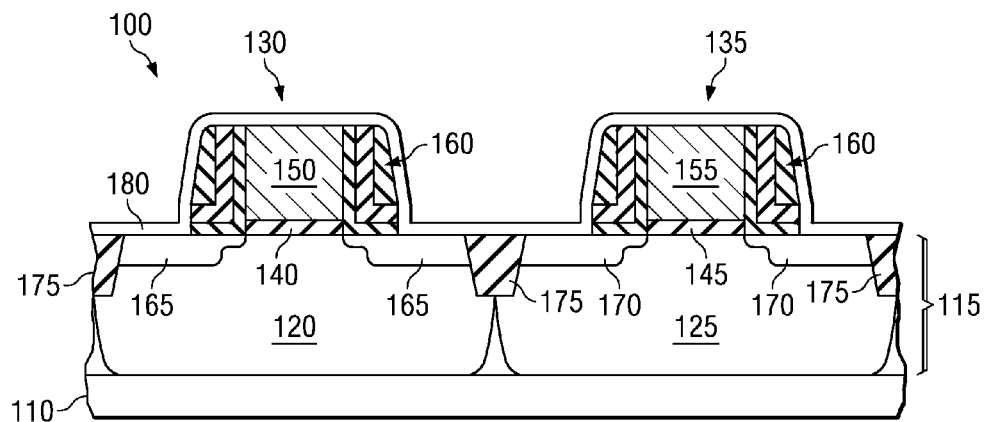
FIGS. 1A-1D illustrate partial cross-sectional views of a semiconductor device manufactured by the invention during formation of various layers used to expose the top of gate electrodes.

FIG. 1A illustrates a view of a semiconductor device 100, as provided by one embodiment of the invention at a stage of manufacture. At this point, the semiconductor device 100 may be of conventional design and may include a conventional substrate 110, such as a silicon wafer, silicon germanium or other known semiconductor substrate. An active layer 115 is located over the substrate. The active layer 115 may be a conventionally formed epitaxial layer or an active layer formed in the substrate 110. Wells 120, 125 are also shown and may be conventional. In the illustrated embodiments, the wells 120, 125 are complementary P-type and N-type wells. Located over the substrate 110 and well region 120 are complementary silicide gate structures 130 135.

In the illustrated embodiment of FIG. 1A, the gate structures 130, 135 include respective gate oxide layers 140, 145, as well as gate electrodes 150, 155 located over the oxide layers 140, 145. The gate electrodes 150, 155 may have a variety of thicknesses, which is dependent on design or function.

The gate structures 130, 135 may further include conventional gate sidewall spacers 160 formed on both sides of the silicided gate electrodes 150, 155. The gate sidewall spacers 160 may each include one or more different layers. For instance the gate sidewall spacers 160 may also include nitride-containing spacers and sidewall oxides. It should be noted that the gate sidewall spacers 160 may comprise many different types and numbers of layers. The semiconductor device 100 may also include conventionally formed source/drain regions 165, 170 located within the substrate 110 and proximate the oxide layers 140, 145. Isolation structures 175 electrically isolate the gate structures 130, 135 from each other.

Also shown in FIG. 1A is an oxide cap layer 180 that is located over the gate structures 130, 135 and the source/drains 165, 170. In one embodiment, the cap layer 180 may be conventionally formed and may be silicon dioxide. The cap layer 180 is beneficial in that its removal can easily be controlled with a hydrofluoric etch to remove it and expose the top portion of the gate electrodes 150, 155, without excessive damage to or removal of the gate electrode material. Accordingly, the cap layer 180 will typically be a relatively thin layer that may have a thickness ranging from about 0.1 nm to about 10 nm, which provides for easy and quick removal.

Figure 1B:
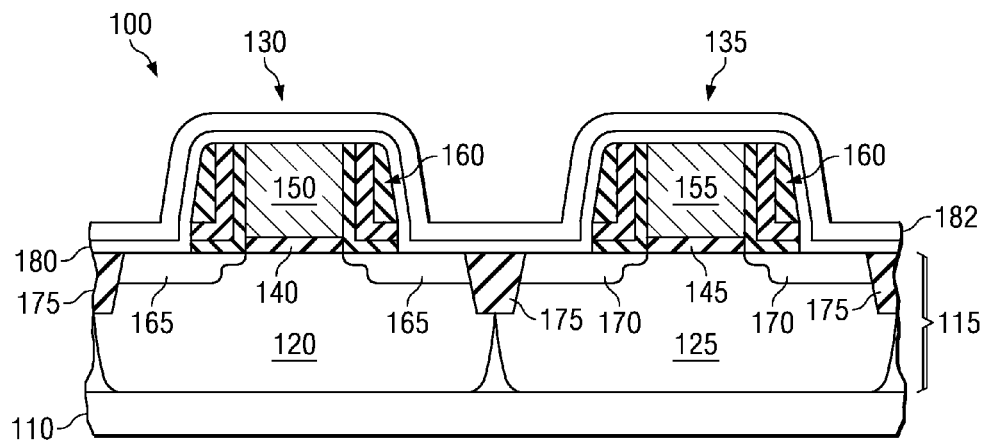

FIG. 1B illustrates the device 100 of FIG. 1A after the formation of a blocking layer 182. A blocking layer is a layer that remains in place over the source/drains and protects them from the silicidation such that the source/drain doping profiles are not operatively affected and the source/drain regions are not excessively silicided during gate full silicidation. The illustrated embodiment shows the blocking layer 182 covering the gate structures 130, 135 and the source/drains 165, 170. The thickness of the blocking layer 182 may be around 2 to 20 nm thick, though the thickness should be controlled such that excessive etching is not necessary to remove the blocking layer 182 from over the source/drains 165, 170 in subsequent processes.

Conventional processes may be used to form the blocking layer 182. For example, in one embodiment, the blocking layer 182 comprises carbon and may be formed using bis (tertiarybutylamino)silane (BTBAS) and ammonia (NH$_3$) precursors in a CVD reactor using a temperature ranging from about 500□C to about 750□C and using pressures ranging from approximately 100 mTorr to about 500 Torr. In another embodiment, the blocking layer 182 may be silicon carbide formed by a conventional deposition process that includes using trimethyl silane or methyl silane, and ammonia. In certain embodiments, the blocking layer 182 has a composition that makes it highly resistive to the hydrofluoric etch that is used to remove overlying oxide and nitride layers, as discussed below, but can be removed using a dry etch, such as a plasma using a hydrofluorcarbon gas. Additionally, the blocking layer 182 should not easily react with a siliciding metal, such as nickel.

Figure 1C:
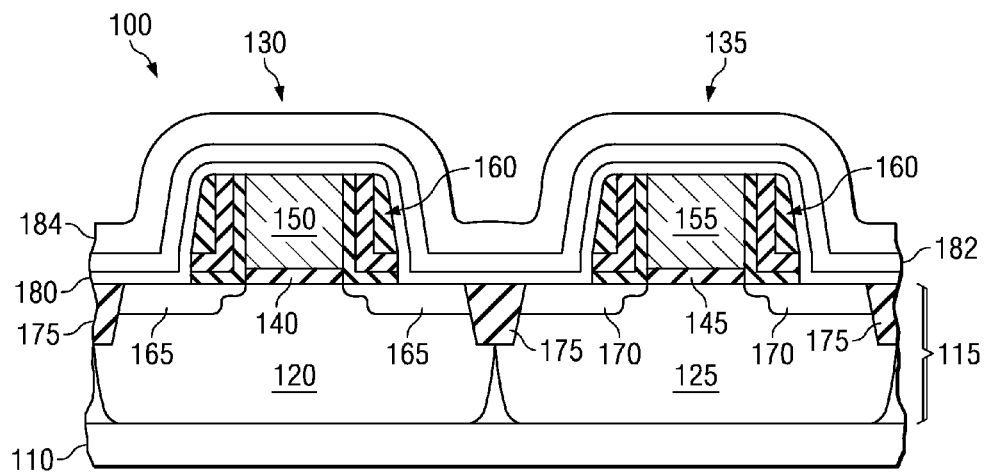

FIG. 1C illustrates the device 100 of FIG. 1B after the formation of a CMP stop layer 184. In one embodiment, conventional processes may be used to form the CMP stop layer 184, which may one or more deposited layers. For example, the CMP stop layer 184 may comprise silicon nitride or silicon-rich nitride.

There are competing interests regarding the blocking layer 182 that the invention addresses. It is desirable that the blocking layer 182 be thicker over the gate structures 130, 135 to make certain that the CMP process removes as little of the gate electrodes 150, 155 as possible. However, it is also desirable to have the blocking layer 182 thinner over the source/drains 165, 170 to reduce the etching necessary to remove the blocking layer 182 and allow for subsequent contact silicidation of the source/drains 165, 170 and minimize removal of the silicided gate electrode material. The use of the CMP stop layer 184 addresses these competing interests by providing different CMP and etch selectivities in the areas of interest.

In one embodiment, the CMP stop layer 184 is comprised of a material that causes it to have a CMP removal rate that is less than a removal rate of an overlying oxide layer (e.g., at least about 3:1) but one that can still be removed with the same dry etch chemistry used to remove the blocking layer 182. Additionally, it can be removed with the same wet chemistry used to remove an overlying bulk oxide layer 186 located over the source/drains 165, 170.

In such embodiments, the presence of the CMP stop layer 184 provides a way to improve control over the CMP process such that the gate electrodes 150, 155 are protected as much as possible during CMP, but allows a thin blocking layer 182 to be used during gate silicidation, as explained below. The CMP stop layer 184 is a layer that has a lesser removal rate than the overlying bulk oxide layer 186. The thickness of the CMP stop layer 184 may vary. For example, its thickness may range from about 10 nm to about 40 nm. This range provides a benefit of providing a reasonable thickness for CMP purposes, but thin enough that excess etching is not required to remove the layer after the gate electrodes 150, 155 are exposed, which could also remove too much of the gate electrode material.

Figure 1D:
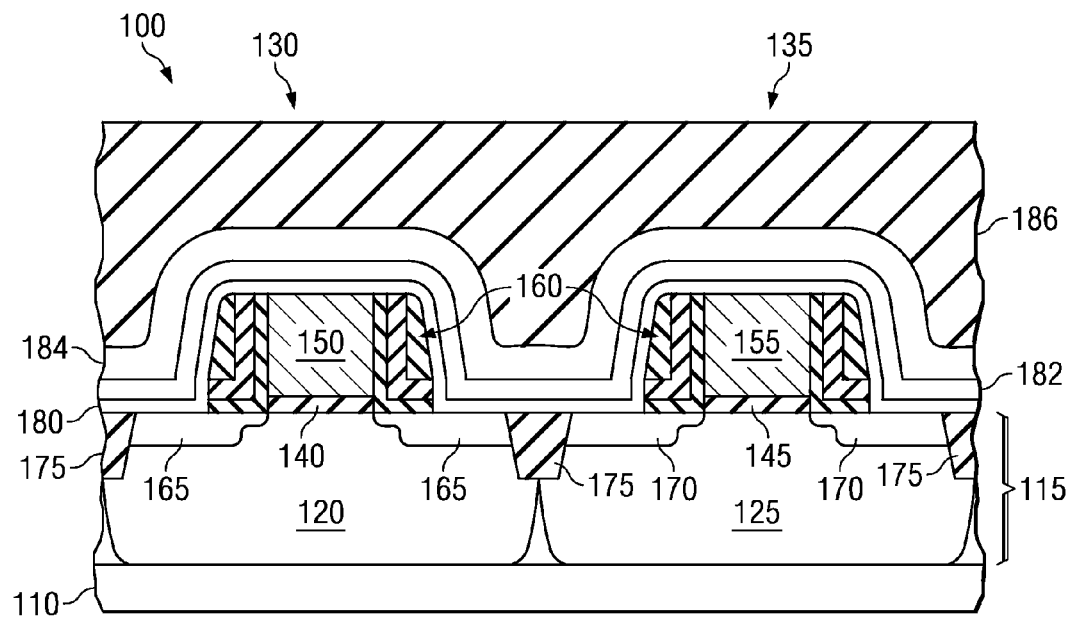

FIG. 1D illustrates the device 100 of FIG. 1C after the formation of a bulk oxide layer 186. Conventional processes may be used to form the oxide layer 186. The oxide layer 186 may be a silicon dioxide material or a high density plasma oxide material, and its thickness may vary, but typically, may be around 300 nm thick. The oxide layer 186 provides a polishing surface and completes the stack of layers that are used to open up the top portion of the gate electrodes 150, 155 for silicidation purposes.

Figure 2A:
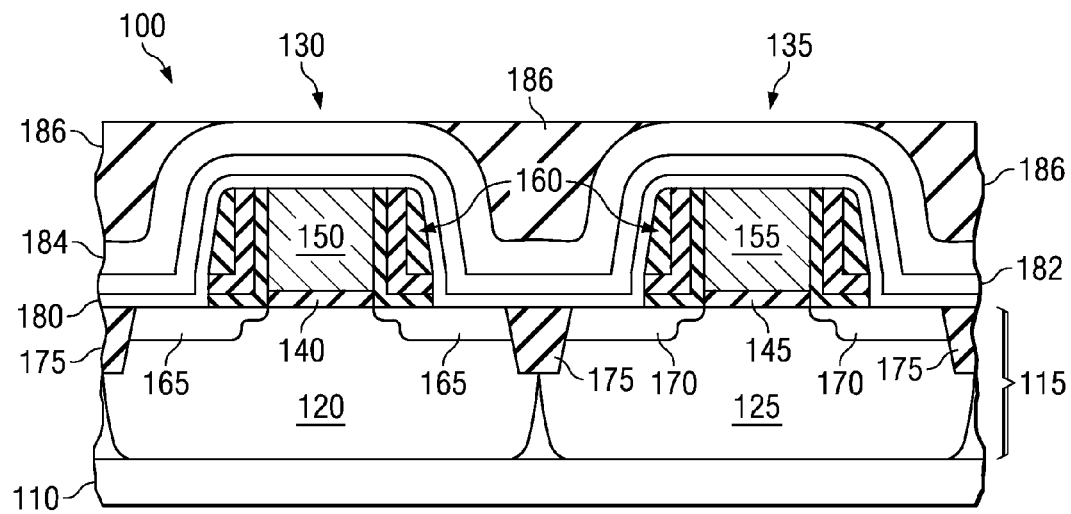
FIGS. 2A-2C illustrate the removal of the layers shown in FIGS. 1A-1D and the exposing of the top of the gate electrodes.
Figure 2B:
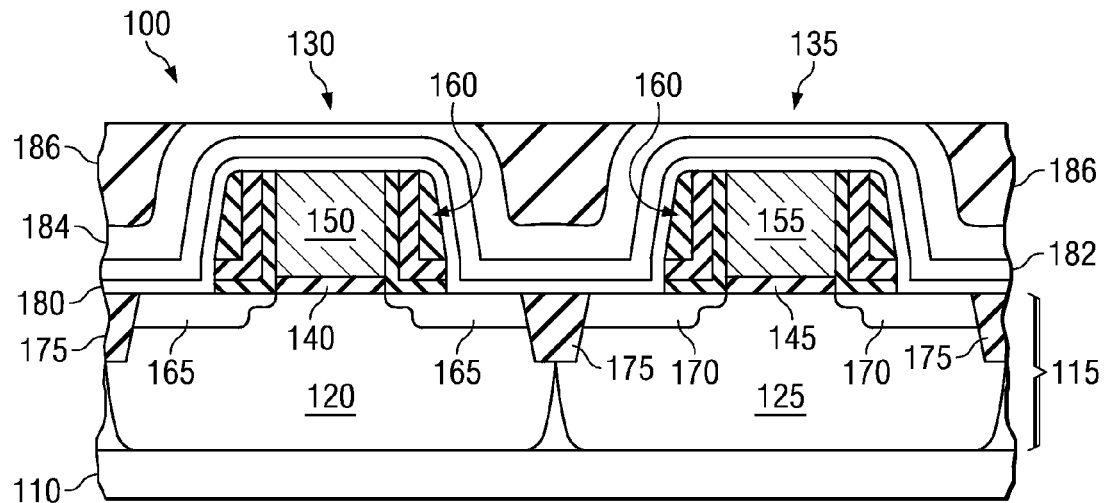

A CMP process is begun and conducted on the device 100 to remove the bulk oxide layer 186 and is continued until the CMP stop layer 184 is reached to expose the CMP stop layer 184, as shown in FIG. 2A. The CMP apparatus and polishing slurries used here may be conventional. As seen in FIG. 2B, in some instances, the CMP process may be continued to remove a portion of the CMP stop layer 184. As is well known, polishing processes do not uniformly remove any given material across the entire wafer, because of the varying component density or topography across the wafer. Therefore, it is possible that when a given layer is reached over one area of the wafer, that same layer in another area of the wafer may be substantially or completely removed. If that layer is the material that comprises the gate electrode, significant damage can occur to those particular gate electrodes. The CMP stop layer 184 helps to lessen the impact of this non-uniform removal.

In one embodiment, the removal rate of the bulk oxide layer 186 is at least about 3 times a removal rate of the CMP stop layer 184. Since the oxide layer 186 is removed at a faster rate than the CMP stop layer 184 and the CMP stop layer 184 is thicker than the blocking layer 182, alone, the polishing process can be better controlled such that overpolishing may not occur in other areas of the wafer as extensively as what occurs when the CMP stop layer 184 is not present. Moreover, the differential in removal rates between the oxide layer 186 and the CMP stop layer 184 provides better control to end the CMP nearer the blocking layer 182.

Figure 2C:
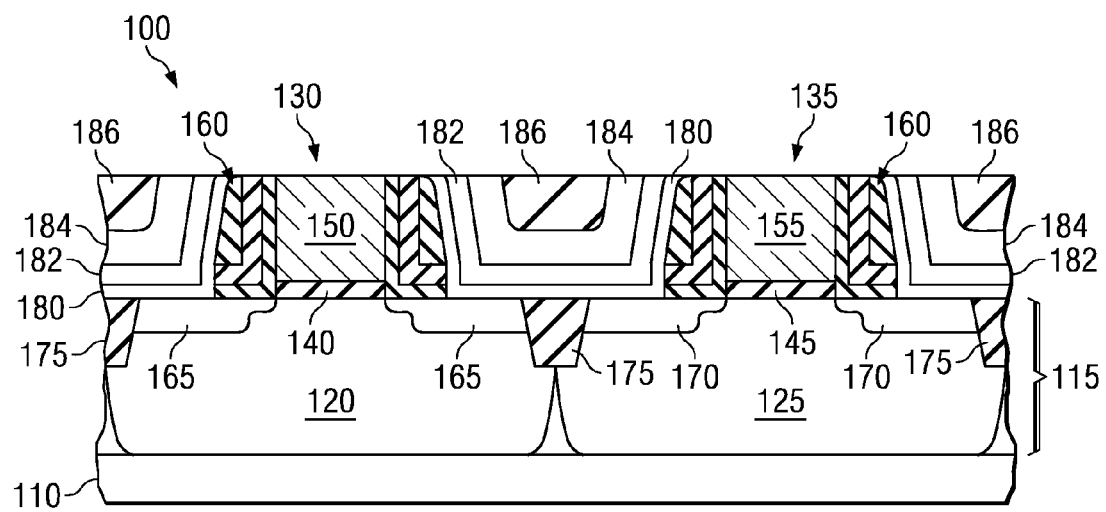

FIG. 2C shows the device 100 after the sequential removal of any remnants of the CMP stop layer 184, and removal of the blocking layer 182, and the oxide cap layer 180 over the gate structures 130, 135. In one embodiment, any remaining portions of the CMP stop layer 184 may be removed with the same dry etch used to remove the blocking layer 182. In one aspect, the dry etch comprises a conventional oxynitride etch using chlorofluorocarbons. In another embodiment, remaining portions of the CMP stop layer 184 and the blocking layer 182 may be removed with different processes. For example, the CMP stop layer 184 may be removed with a wet etch chemistry, such as a hydrofluoric etch, while the blocking layer 182 may be removed with a dry etch, such as the one described above. An example of the hydrofluoric etch that might used is about a 0.49% to about 4.9% HF diluted in water.

Following removal of remaining portions of the CMP stop layer 184 and the blocking layer 182, the oxide cap layer 180 may be removed with a standard hydrofluoric etch process, as the one mentioned above. The removal of these layers exposes the top portion of each of the gate electrodes 150, 155. At this point, portions of the bulk oxide layer 186, the CMP stop layer 184, blocking layer 182, and the oxide cap layer 180 remain over the source/drains 165, 170.

Figure 3A:
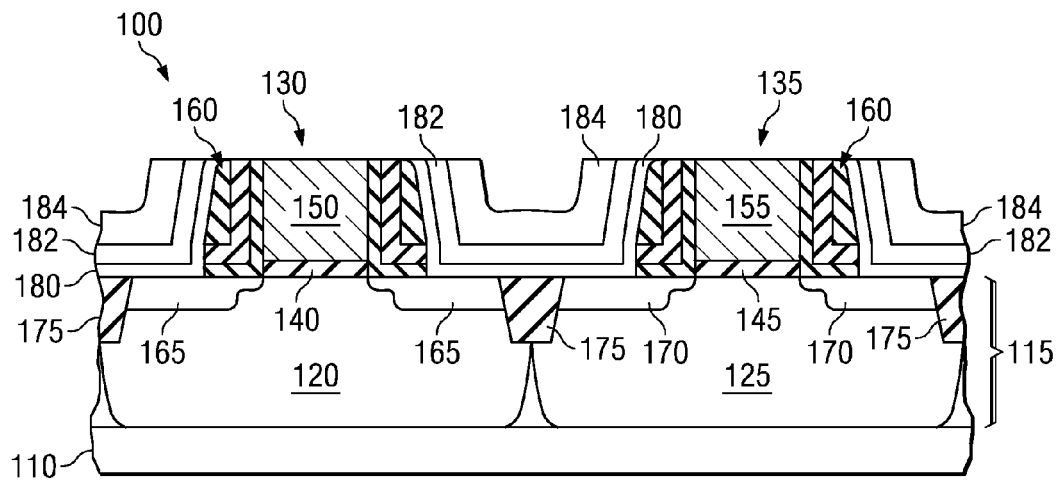
FIGS. 3A-3B illustrate the removal of the bulk oxide layer and the CMP stop layer.
Figure 3B:
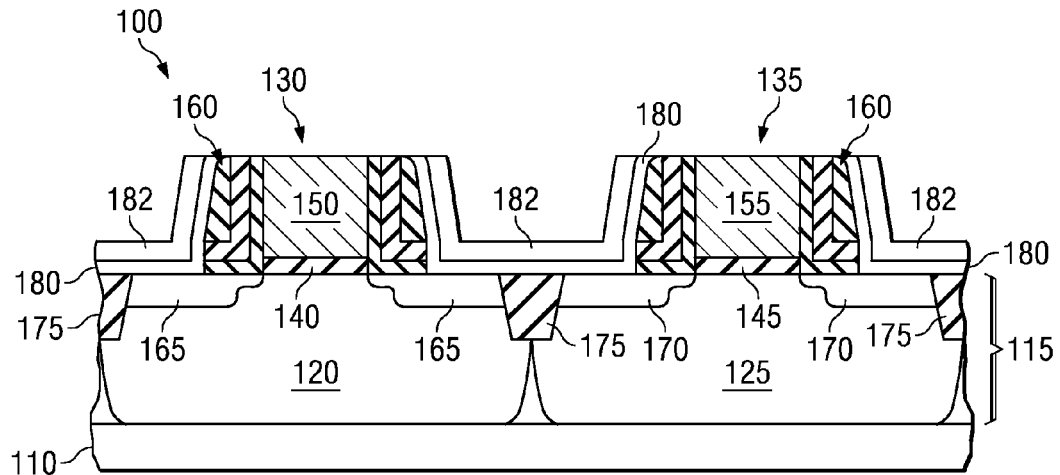

In one aspect, remaining portions of the bulk oxide layer 186 may be removed from over the source/drains 165, 170 with a hydrofluoric etch, as illustrated in FIG. 3A. The hydrofluoric etch may be the same chemistry, as mentioned above. This may be a continuation of the hydrofluoric etch that removes the oxide cap layer 180 from the top of the gate electrodes 150, 155, or it may be a separate etch process. In FIG. 3B, the CMP stop layer 184 may also be removed by the same wet etch process used to remove the bulk oxide 186. However, due to the different compositions of the CMP stop layer 184 and the blocking layer 182, the wet etch may remove the CMP stop layer 184 at least about 10 times faster than the blocking layer 182, in one embodiment, and in another the removal rate may be at least about 20 time faster. Thus, upon complete removal of the bulk oxide layer 186 and the CMP stop layer 184, a substantial portion of the blocking layer 182 remains in place to protect the underlying source/drains 165, 170 from subsequent silicidation processes.

Figure 4:
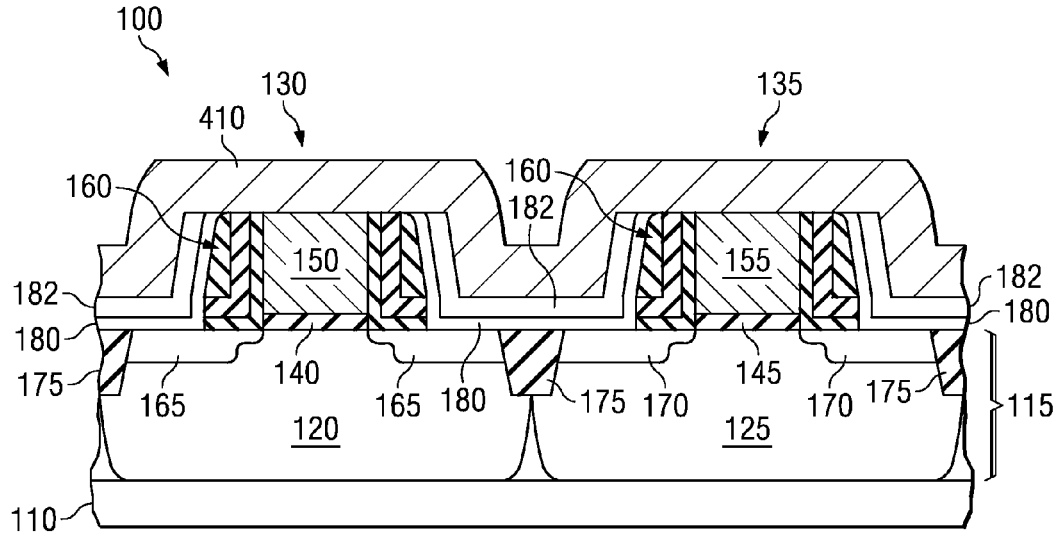
FIGS. 4-7 illustrate the silicidation of the gate electrodes, the removal of the blocking layers, and the formation of silicide contact pads.

Following the removal of the bulk oxide layer 186 and CMP stop layer 184, a metal layer 410 is deposited over the gate electrodes 150, 155, as shown in FIG. 4. Conventional deposition processes may be used to place the metal layer 410 over the exposed surfaces of the gate electrodes 150, 155 and source/drains 165, 170. The thickness of the metal layer 410 may vary and will depend, in some embodiments, on the thickness of the gate electrodes 150, 155. For example, in one embodiment where the thicknesses of the gate electrodes 150, 155 are about 80 nm thick, the thickness of the metal layer 410 will be about 60 nm. Preferably, the metal layer 410 is thick enough such that full silicidation of the gate electrodes 150, 155 occurs. However, in other embodiments, full silicidation may not be necessary. In such cases, the metal layer 410 may be thinner. However, in embodiments where the gates are fully silicided, the metal layer 410 needs to be thick enough to allow full silicidation. Full silicidation does not need to be accomplished during a first rapid thermal anneal with the full metal layer in place. For full silicidation, the gate will need to eventually (e.g., after residual metal strip and subsequent RTP2) be fully silicided. The silicidation can be conducted until the desired work function of the respective gate electrodes 150, 155 is achieved, or they are fully silicided.

The metal layer 410 may be nickel. In those embodiments where the metal layer 410 is nickel, an exemplary silicide process comprises placing a blanket layer of nickel over the gate electrodes 150, 155. As it takes approximately 1 nm of nickel to fully silicide approximately 1.8 nm of polysilicon, the thickness of the blanket layer of nickel should be at least 56% of the thickness of the gate electrodes 150, 155. To be comfortable, however, it is suggested that the thickness of the layer of nickel should be at least 60% of the thickness of the gate electrode 150, 155. Thus, where the thickness of the gate electrodes 150, 155 ranges from about 50 nm to about 150 nm, as described above, the thickness of the blanket layer of nickel should range from approximately 30 nm to about 90 nm. It should also be noted that the blanket layer of metal layer 410 may comprise a number of different metals or combinations of metals, such as nickel and platinum, while staying within the scope of the present invention.

The nickel layer and the gate electrodes 150, 155 are subjected to a thermal anneal having a temperature ranging from about 400 degrees centigrade to about 600 degrees centigrade and for a period of time ranging from about 10 seconds to about 100 seconds. This forms silicided gate electrodes 550, 555, see FIG. 5. It should be noted, however, that the silicidation process may vary depending on the amount of silicidation that is desired and the materials that are used to silicide the gate electrodes 150, 155. In some cases, after this first silicidation process there will still be polysilicon remaining below the silicide layer formed by the anneal.

Figure 5:
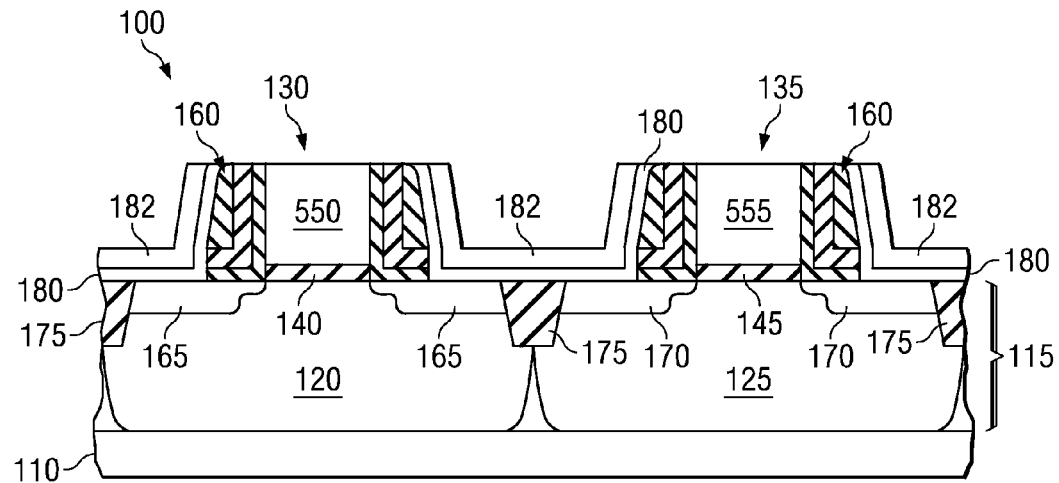

After forming silicided gate electrodes 550, 555, any remaining or unreacted metal materials can be removed using conventional processes to arrive at the device 100 shown in FIG. 5. It should be noted that the silicide does not form on the source/drains 165, 170 at this time because the blocking layer 182, and to a certain extent the oxide cap layer 180, prevents the silicidation process from siliciding the source/drains 165, 170.

The silicided gate electrodes 550, 555 may also include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so-called work function.

If the first anneal is engineered such that the gate electrodes 150 and 155 are not fully consumed, then after the selective metal strip to remove unreacted metal, there may be a second RTP that serves to drive the reaction to completion to form fully silicided gates 550, 555.

Figure 6:
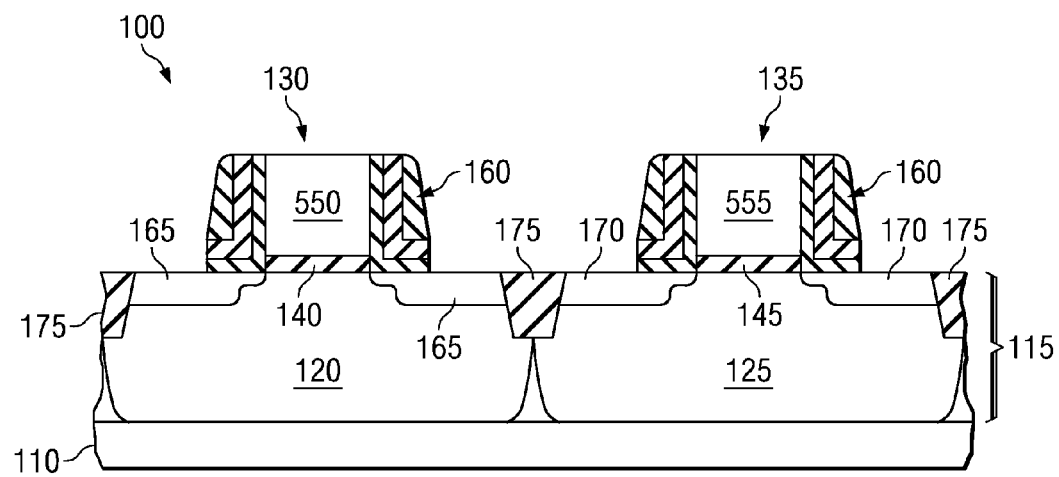

Following the silicidation process and removal of the excess metal layer 410, the blocking layer 182 may be removed with the previously described dry plasma etch, and a hydrofluoric clean-up etch may also be conducted, which easily removes the oxide cap layer from the source/drain 165, 170 regions, that results in the device 100 shown in FIG. 6.

Figure 7:
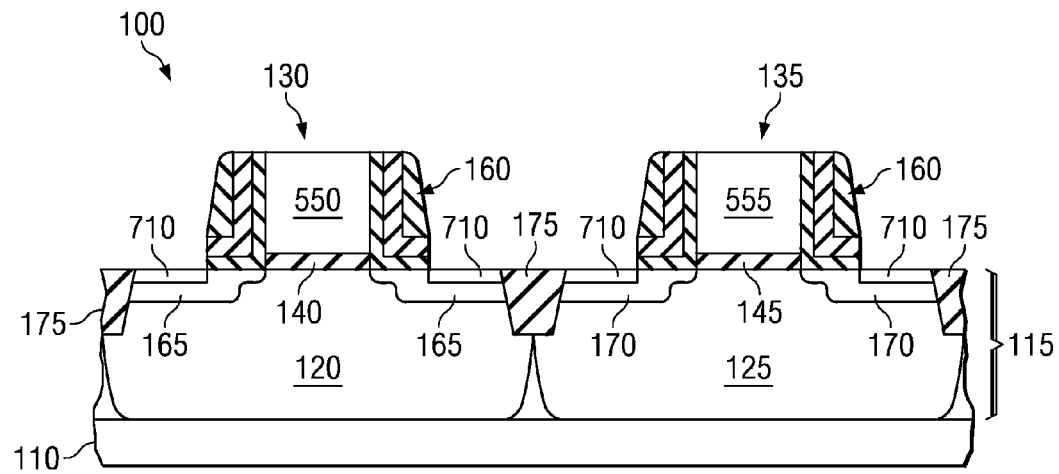

A conventional source/drain silicidation process may then be conducted to form silicidation contact pads 710, which results in the semiconductor device 100 shown in FIG. 7. The silicided contact pads 710, in one embodiment, may comprise nickel silicided source/drain contact pads. However, other silicidation materials could be used to form the silicided contact pads 710 and remain within the scope of the present invention. The depth into which the silicided contact pads 710 extend into the source/drains 165, 170 may vary. For example, the depth may range from about 10 nm to about 30 nm.

It should be understood that though the foregoing discussion is directed to a gate silicidation process, the invention is not limited to just a silicidation process. The embodiments described above may be used in any process where it is desirable to expose the top portion of gate electrodes. For example in some cases it may be desirable to amorphize the gate electrodes while protecting the source/drain regions, or it may be desirable to implant the gate electrodes with dopants while protecting the source/drains. In such instances, the embodiments described above may also be used for these purposes.

It should also be noted that within the scope of this invention, the silicided contact pads 710 can be formed prior to formation of the cap layer 180 and the gate full silicidation. While the silicided contact pads 710 can have the benefit of protecting the source/drain regions during gate full silicidation, having layer 182 in place during the gate full silicidation adds a significant measure of margin to the process flow. In this case, both the source/drain silicidation and the blocking layer 812 would prevent excessive source/drain silicidation.

Figure 8:
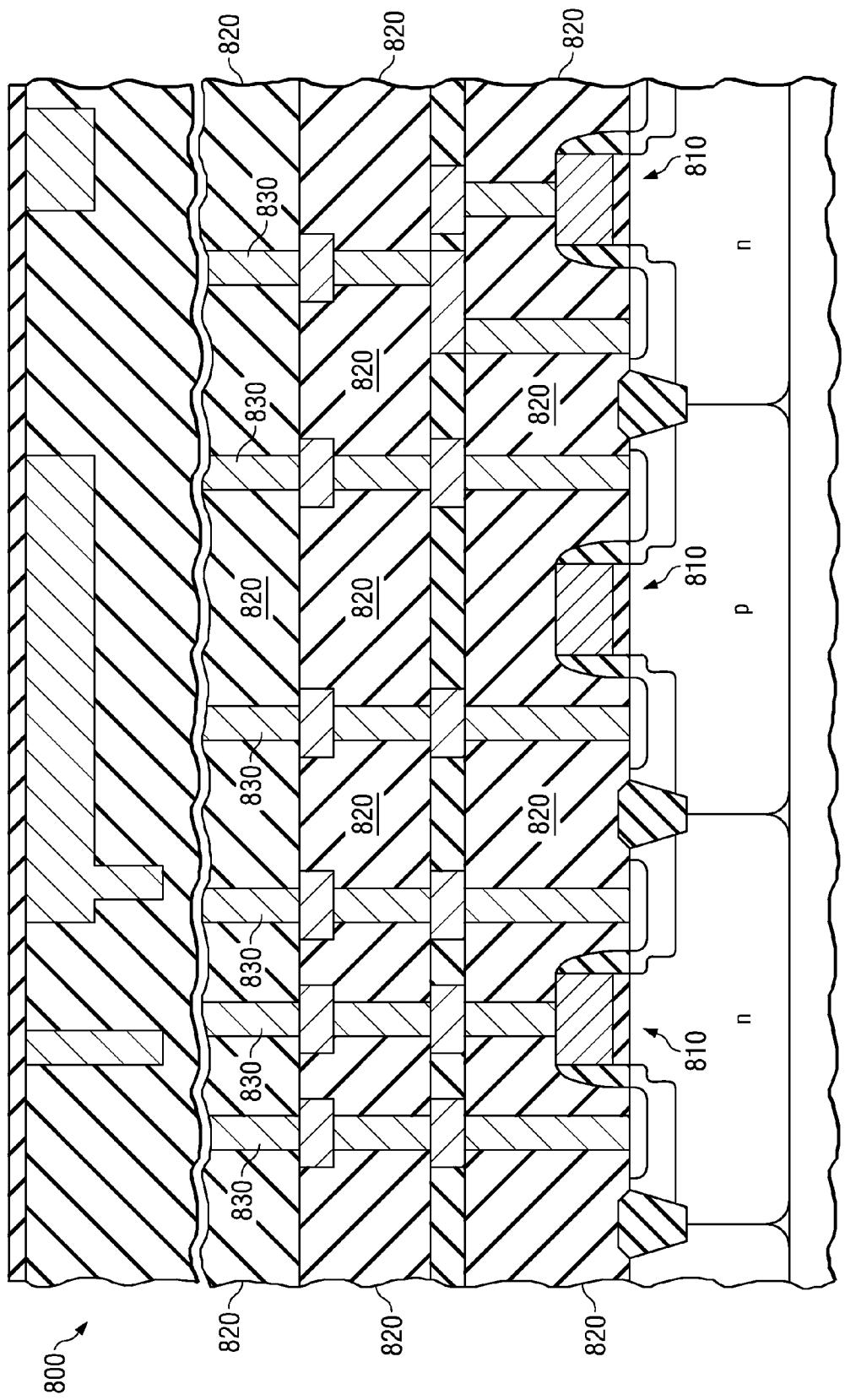
FIG. 8 illustrates an integrated circuit (IC) into which the device of FIG. 7 may be incorporated.

FIG. 8 illustrates semiconductor device 100 configured as an integrated circuit (IC) 800. The structure shown in FIG. 7 generally designated as device 810, including the various embodiments discussed herein, may be incorporated into the IC 800 by conventional process. The devices 810 may include a wide variety of devices, such as transistors used to form CMOS devices, BiCMOS devices, bipolar devices, as well as capacitors or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the devices 810 are transistors over which dielectric layers 820 are located, and the transistors may be fabricated in accordance with the various embodiments discussed above. Additionally, interconnect structures 830, which may include damascene, dual damascene, (both of which are shown for illustrative purposes only), or other convention interconnect structures, are located within the dielectric layers 820 to interconnect various devices 810, thus, forming the operative IC 800.

Those skilled in the art will appreciate that other and further additions, deletions, substitutions and modifications may be made to the described embodiments without departing from the scope of the invention.

What is claimed is:

1. A method of manufacturing a semiconductor device, comprising:
   placing a blocking layer over an oxide cap layer located over a gate electrode and sidewall spacers and source/drains located adjacent thereto;
   forming a chemical/mechanical polishing (CMP) stop layer over the blocking layer;
   forming a bulk oxide layer over the CMP stop layer;
   removing the bulk oxide layer with a CMP process to expose at least the CMP stop layer located over the gate electrode, wherein a removal rate of the bulk oxide layer is at least about 3 times greater than a removal rate of the CMP stop layer;
   removing portions of the CMP stop layer, the blocking layer, and the oxide cap layer to expose a top portion of the gate electrode; and
   removing the bulk oxide and the CMP stop layer located over the source/drains with a wet etch, wherein a wet etch removal rate of the CMP stop layer is at least about 10 times greater than a removal rate of the blocking layer.

2. The method recited in claim 1, wherein the blocking layer is formed by a deposition process that includes using bis(tertiarybutylamino)silane (BTBAS) and ammonia (NH3).

3. The method recited in claim 1, wherein the blocking layer is silicon carbide formed by a deposition process that includes using trimethyl silane or methyl silane, and ammonia.

4. The method recited in claim 1, wherein forming the CMP stop layer includes forming a silicon nitride or silicon-rich nitride layer.

5. The method recited in claim 1, wherein removing the portions of the CMP stop layer, the blocking layer, and the oxide cap layer to expose a top portion of the gate electrode includes using a dry etch process to remove the portions of the CMP stop layer and the blocking layer; and removing the cap oxide layer includes using a hydrofluoric etch.

6. The method recited in claim 1, wherein the wet etch is a hydrofluoric etch.

7. The method recited in claim 1, wherein a thickness of the blocking layer is about 8 nm; and a thickness of the CMP stop layer is about 10 nm to about 40 nm.

8. The method recited in claim 1, further including:
   forming a metal layer over the exposed portion of the gate electrode and blocking layer located over the source/drains subsequent to removing the bulk oxide and the CMP stop layer located over the source/drains; and
   siliciding the gate electrode with the metal layer.

9. The method recited in claim 8, further including:
   removing the blocking layer subsequent to siliciding the gate electrode;
   removing the oxide cap layer; and
   forming silicided contacts over the source/drains subsequent to removing the blocking layer and the oxide cap layer.

10. The method recited in claim 1, wherein removing the bulk oxide layer with a CMP process to expose at least the CMP stop layer includes removing a portion of the CMP stop layer.

11. A method of manufacturing a semiconductor device, comprising:
    placing a blocking layer formed with bis(tertiarybutylamino)silane (BTBAS) precursor over a silicon dioxide cap layer located over a gate electrode and sidewall spacers and source/drains located adjacent thereto;
    forming a chemical/mechanical polishing (CMP) stop layer comprising silicon nitride over the blocking layer;
    forming a bulk silicon oxide layer over the CMP stop layer;
    removing the bulk silicon oxide layer with a CMP process to remove at least a portion of the CMP stop layer located over the gate electrode, wherein a removal rate of the bulk silicon oxide layer is at least about 3 times greater than a removal rate of the CMP stop layer;
    removing portions of the CMP stop layer, the blocking layer, and the cap silicon dioxide cap layer to expose a top portion of the gate electrode; and
    removing the bulk silicon oxide and the CMP stop layer located over the source/drains with a wet etch, wherein a wet etch removal rate of the CMP stop layer is at least about 10 times greater than a removal rate of the blocking layer.

12. The method recited in claim 11, wherein forming the blocking layer includes forming the blocking layer to a thickness of about 8 nm; and forming the CMP stop layer includes forming the CMP stop layer to a thickness of about 10 nm to about 40 nm.

13. The method recited in claim 11, wherein the CMP stop layer is a silicon-rich nitride layer.

14. The method recited in claim 11, wherein removing the portions of the CMP stop layer, the blocking layer, and the silicon dioxide cap layer to expose a top portion of the gate electrode includes using a dry etch process to remove the portions of the CMP stop layer and the blocking layer; and removing the silicon dioxide cap oxide layer includes using a hydrofluoric etch.

15. The method recited in claim 14, wherein the wet etch is a hydrofluoric etch.

16. The method recited in claim 11, further including:
forming a metal layer over the exposed portion of the gate electrode and blocking layer located over the source/drains subsequent to removing the bulk oxide and the CMP stop layer located over the source/drains;
siliciding the gate electrode with the metal layer to form a silicide gate electrode;
removing the blocking layer; and
forming silicided contact regions over or within the source/drains subsequent to removing the blocking layer.

17. The method recited in claim 16, wherein the semiconductor device is an integrated circuit and the method further includes:
forming a plurality of silicide gate electrodes and silicided contact regions;
forming dielectric layers over the silicided gate electrodes; and
forming interconnects over or within the dielectric layers to interconnect the gate electrodes.

18. A method of manufacturing a semiconductor device, comprising:
providing a substrate having an active area with p-type and n-type wells; gate structures including gate electrodes formed over gate oxide layers respectively formed over the wells; gate sidewall spacers formed on opposite sides of the gate structures; and source/drain regions located adjacent the sidewall spacers;
forming an oxide cap layer over the gate structures and over the source/drain regions;
forming a blocking layer over the oxide cap layer over the gate structures and the source/drain regions;
forming a chemical-mechanical polishing (CMP) stop layer over blocking layer over the oxide cap, the gate structures and the source/drain regions;
forming a bulk oxide layer over the CMP stop layer over the blocking layer, the oxide cap, the gate structures and the source/drain regions;
performing a chemical-mechanical polishing to remove the bulk oxide layer down to the CMP stop layer;
performing a first etch to remove portions of the CMP stop layer and the blocking layer above the gate electrodes;
performing a second etch to remove portions of the oxide cap layer down to the gate electrodes, exposing top portions of the gate electrodes and leaving portions of the bulk oxide layer, the CMP stop layer, the blocking layer and the oxide cap layer remaining over the source/drain regions;
performing a third etch to remove remaining portions of the bulk oxide layer and the CMP stop layer from over the source/drain regions, leaving the portions of the blocking layer and the oxide cap layer remaining over the source/drain regions;
forming a blanket layer of metal over the gate electrodes and over the portions of the blocking layer and the oxide cap layer left remaining over the source/drain regions;
performing a thermal anneal to silicide the gate electrodes by reaction with the blanket layer of metal; siliciding of the source/drain regions being prevented by the portions of the blocking layer and the oxide cap layer left remaining over the source/drain regions;
removing unreacted portions of the blanket layer of metal;
performing a fourth etch to remove the portions of the blocking layer and the oxide cap layer remaining over the source/drain regions; and
siliciding the source/drain regions to form silicided source/drain contact pads.

* * * * *